(12) United States Patent
Yilmaz et al.

(10) Patent No.: US 11,940,493 B1
(45) Date of Patent: Mar. 26, 2024

(54) FLEXIBLE ONE-HOT DECODING LOGIC FOR CLOCK CONTROLS

(71) Applicant: NVIDIA Corp., Santa Clara, CA (US)

(72) Inventors: Mahmut Yilmaz, Los Altos Hills, CA (US); Vinod Pagalone, San Jose, CA (US); Munish Aggarwal, Santa Clara, CA (US); Doochul Shin, Sunnyvale, CA (US)

(73) Assignee: NVIDIA CORP., Santa Clara, CA (US)

( * ) Notice: Subject to any disclaimer, the term of this patent is extended or adjusted under 35 U.S.C. 154(b) by 0 days.

(21) Appl. No.: 17/932,808

(22) Filed: Sep. 16, 2022

(51) Int. Cl.
*G01R 31/3185* (2006.01)
*G01R 31/317* (2006.01)

(52) U.S. Cl.
CPC .......... *G01R 31/318536* (2013.01); *G01R 31/31727* (2013.01); *G01R 31/318597* (2013.01)

(58) Field of Classification Search
CPC ...... G01R 31/318536; G01R 31/31727; G01R 31/318597
USPC .......................................... 714/726, 729, 731
See application file for complete search history.

(56) References Cited

U.S. PATENT DOCUMENTS

| | | | | | |
|---|---|---|---|---|---|
| 5,848,074 | A * | 12/1998 | Maeno | ........... | G01R 31/318541 714/720 |
| 8,479,068 | B2 * | 7/2013 | Periasamy | ..... | G01R 31/318552 714/731 |
| 8,522,190 | B1 * | 8/2013 | Sanghani | ....... | G01R 31/318552 716/108 |
| 9,159,446 | B2 * | 10/2015 | Schultz | ................ | H03K 23/548 |
| 9,209,792 | B1 * | 12/2015 | Browning | .......... | H03K 19/0013 |
| 11,714,131 | B1 * | 8/2023 | Srinivasan | ..... | G01R 31/318533 714/726 |
| 2006/0152247 | A1 * | 7/2006 | Murakami | ......... | H03K 19/1737 326/38 |
| 2013/0003911 | A1 * | 1/2013 | Schultz | .................. | G11C 19/00 377/54 |
| 2013/0083613 | A1 * | 4/2013 | Phan | ...................... | G11C 5/148 365/226 |
| 2013/0271197 | A1 * | 10/2013 | Sanghani | ....... | G01R 31/318552 327/225 |
| 2014/0101501 | A1 * | 4/2014 | Devta Prasanna | | G01R 31/318544 714/E11.034 |

OTHER PUBLICATIONS

Wang et al., Using Launch-on-Capture for Testing BIST Designs Containing Synchronous and Asynchronous Clock Domains, Feb. 2010, IEEE, vol. 29, No. 2, pp. 299-312. (Year: 2010).*
Wu et al., Logic BIST Architecture Using Staggered Launch-on-Shift for Testing Designs Containing Asynchronous Clock Domains, 2010, IEEE, pp. 358-366. (Year: 2010).*

* cited by examiner

*Primary Examiner* — John J Tabone, Jr.
(74) *Attorney, Agent, or Firm* — Rowan TELS LLC

(57) ABSTRACT

A circuit for improving control over asynchronous signal crossings during circuit scan tests includes multiple scan registers and a decoder configured to translate a combined output of the scan registers into multiple one-hot controls to the local clock gates of scan registers disposed in multiple different clock domains. Programmable registers are provided to selectively enable and disable the local clock gates of the different clock domains.

17 Claims, 5 Drawing Sheets

FLEXIBLE ONE-HOT DECODING LOGIC FOR CLOCK CONTROLS

BACKGROUND

Scan tests on electronic circuits may utilize a launch-and-capture procedure to test the logic bounded by scan flip-flops. Capture clock pulses are triggered within a timing window. The tests do not typically control, detect, or interpret timing violations.

As a result, when a signal transition is captured on an asynchronous crossing, it may express as a hold violation and may be forced to an unknown value (e.g., "X" ambiguously indicating either "1" or "0") by the users of the testing tool.

The presence of X values in a scan test may result in test coverage loss and increased test time when hardware compression mechanisms are utilized. Examples of hardware compression mechanisms are Multiple Input Signature Registers (MISRs) and XOR trees that compress test responses onto a narrow bus. For example, consider a chip comprising 1000 scan chains in a given partition. The 1000 scanned out signals may be compressed into a small number bits using hardware compression. If any one of those 1000 scan out signals is X, it will corrupt all the other scan outs in the same compression cone as well, causing significant coverage loss.

The testing tool may try to recover the coverage loss by identifying patterns that can prevent such transitions. Even if successful, such a process may require the application of many additional test patterns.

One type of scan test is the Design for Testing (DFT) test. DFT scan tests typically utilize clock controls of the design under test (DUT) at the clock root of a given design block (e.g., chiplet or IP). This is the point where scan test vectors may control how many pulses the given functional clock will produce during a test pattern. For example, if the test requires that clock domain to have two capture pulses, the testing device may load On-Chip Clock Control (OCC) flip-flops accordingly to generate those two pulses at the desired points. The test tool may also load the OCC with all-zero values to disable clock pulsing completely, as needed.

Such scan tests typically do not provide a fine-tuned control beyond the OCC points. For example, a scan test may not be able to pulse the clock for half of a clock domain that is controlled by the same OCC. All the logic controlled by the OCC clock group receives the same clock pulses. In some cases, it may be desirable to have finer control of the clock pulses during a test. For instance, the same OCC may control a group of logic that is functionally asynchronous. In this case, when OCC controls create a pulse in that clock region, it may create signal transitions between two asynchronous clock domains, causing Xs in signal values.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
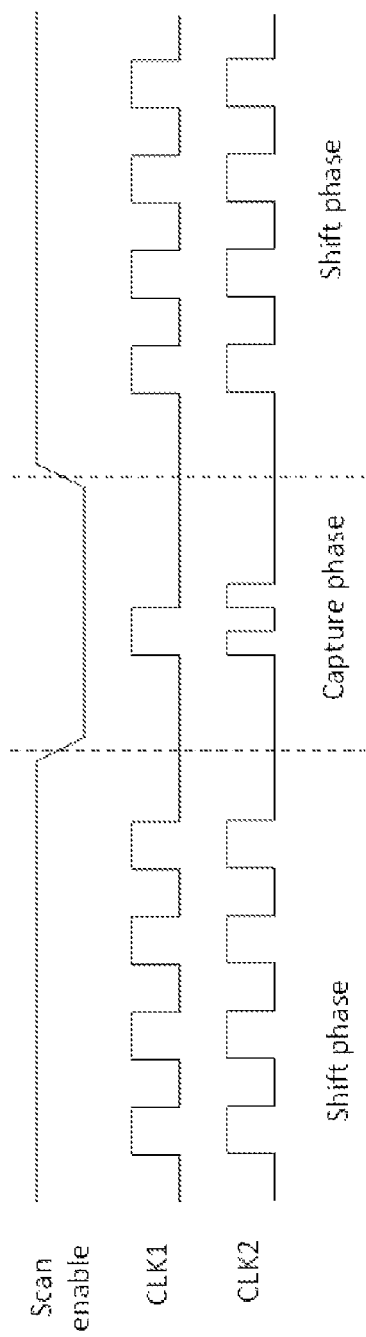
FIG. 1 depicts two main phases of a DFT scan test.

Disclosed herein are hardware mechanisms to enable for fine-tuned clock control by adding programmable DFT overrides on local clock gates, e.g., clock-gating latches (CGs). This mechanisms enable a single one of the asynchronous clock domains to create capture clock pulses at a time, for a given test pattern. Programmability may be achieved by Joint Test Action Group (JTAG) override settings, so that if some of the clock domains are later deemed to be not asynchronous (e.g., due to design changes), they may be removed from one-hot clock control restrictions.

The disclosed mechanisms utilize logic to generate one-hot signals for any number of clock domains, and enabling the programmatic (i.e., reconfigurable) removal of some clock domains from one-hot constraints. Improved test-coverage, reduced time to design closure, and reduced time to market may thereby be enabled.

In one aspect, a one-hot generation and control circuit includes a plurality of scan registers (e.g., scan flip-flops), a decoder coupled to translate a combined output of the scan registers into a plurality of one-hot control signals, and local clock gates in a plurality of different clock domains coupled to receive the one-hot control signals. Herein, "register" refers to any type of various well-known sample-and-hold circuits comprising an input (e.g., a clock terminal) to trigger propagation of their inputs to their outputs, such as flip-flops and latches. A "local clock gate" is such a register device interposed between clocking logic and/or an on-chip clock control circuit and the clock input of another register device. The local clock gates may control an asynchronous signal crossing between a scan register in the first clock domain and a scan register in the second clock domain. Combinational logic may be utilized to enable or disable the local clock gates based on values of the one of the one-hot control signals and a local (to the local clock gate) enable signal.

The one-hot generation and control circuit may also include a plurality of programmable registers (e.g., JTAG flip-flops), and logic (e.g., combinational logic) to apply outputs of the programmable registers to selectively enable and disable individual ones of the local clock gates. "Programmable" means that the content of the registers may be changed via the execution of software.

The circuit may also include further includes a "global" programmable register (e.g., a JTAG flip-flop), and logic (e.g., combinational logic) to apply an output of the programmable register to disable all of the one-hot control signals.

In one aspect, each of the one-hot controls may be applied to a first local clock gate in a first clock domain, and inverted and applied to a second local clock gate in a second clock domain, such that only one of the first local clock gate and second local clock gate are enabled at one time when the one-hot control is asserted. The first clock domain and the second clock domain operate from different on-chip clock controls, or may operate from a common on-chip clock control.

Other technical features may be readily apparent to one skilled in the art from the following figures, descriptions, and claims.

FIG. 1 depicts two main phases of a DFT scan test. The shift phase occurs while a signal scan enable is on (e.g., scan enable=1). During the shift phase, scan flip-flops are loaded with new test vectors and at the same time captured values from the previous test pattern are unloaded. All the scan flip-flops operate from the same scan shift clock in this phase. The scan shift clock is typically a slow clock relative to the functional clocks of the circuit under test. In the shift phase, functional data paths of the flip-flops are not active, such that D inputs of the flip-flops are blocked and only scan chain inputs (e.g., SI inputs of the scan flops), are utilized.

The capture phase occurs while the scan enable signal is off (e.g., scan enable=0). During the capture phase, the clock control logic driven by OCC generates capture clock pulses. Depending on the OCC control values, the clock control logic generates one or more pulses, or no clock pulses at all. Generally, different test modes may utilize different numbers of clock pulses or no clock pulses. For example, the so-called stuck-at test mode utilizes a single pulse (from CLK1 in FIG. 1), while the so-called at-speed test utilizes at least two clock pulses (from CLK2 in FIG. 1). Asynchronous crossings between flip-flops may be detected in the capture phase.

Figure 2B:
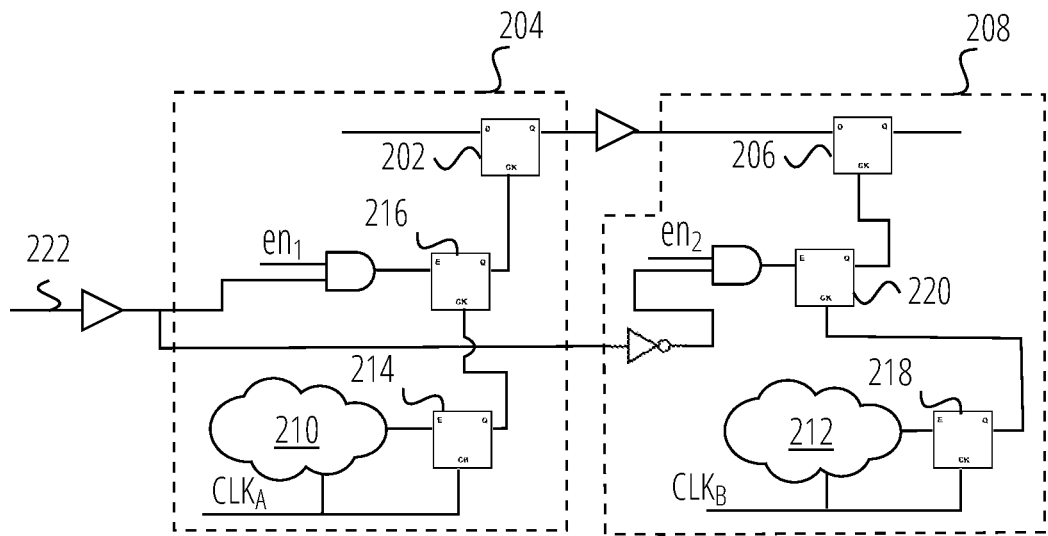
FIG. 2B depicts the addition of one-hot clock control to local clock gate flip-flops at the asynchronous crossing in one embodiment.
Figure 2A:
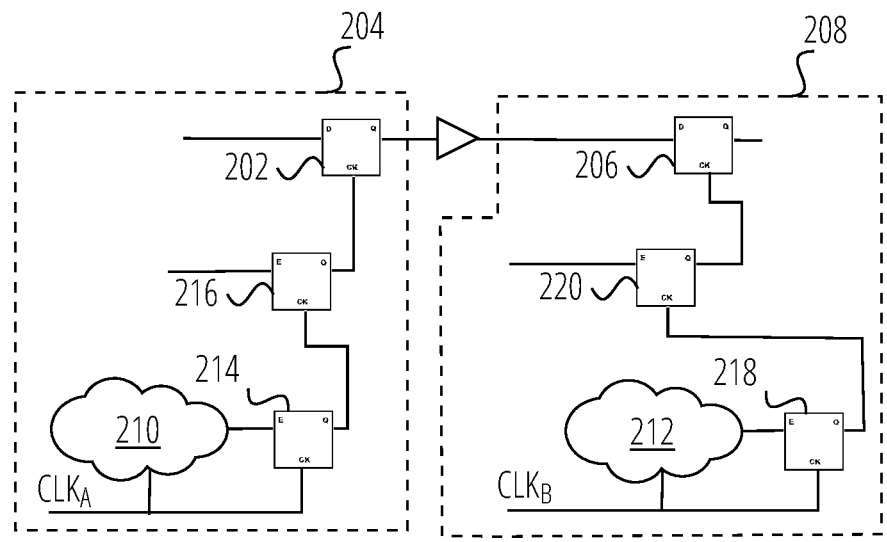
FIG. 2A depicts an synchronous signal crossing between two scan flip-flops.

FIG. 2A depicts an synchronous signal crossing between two scan flip-flops. Scan flip-flop 202 operates in clock domain 204, and scan flip-flop 206 operates in clock domain 208. In the depicted example, the clock domains have different OCC controls, namely, OCC control 210 for clock domain 204 and OCC control 212 for clock domain 208. The OCC control 210 for clock domain 204 is gated by clock-gate latch 214 and clock-gate latch 216, and the OCC control 212 for clock domain 208 is gated by clock-gate latch 218 and clock-gate latch 220.

To prevent X in the scan out signal values, a test tool may pulse either $CLK_A$ or $CLK_B$, but not both at the same time, in a pattern. In this manner a transition from scan flip-flop 202 to scan flip-flop 206 is avoided entirely (when $CLK_A$ is off), or else the generated transition is not recorded in scan flip-flop 206 (when $CLK_B$ is off). The result of this approach is essentially is a one-hot clock enable scheme enforced by the test tool. This addresses the X-signal creation problem at the cost of requiring more patterns to provide test coverage of the logic under test.

FIG. 2B depicts the addition of one-hot clock control to local clock gate flip-flops at the asynchronous crossing in one embodiment. The one-hot controls on clock-gate latch 216 and clock-gate latch 220 obviate the possibility of X-valued signals on the path between scan flip-flop 202 and scan flip-flop 206. The clock-gate latch 216 and clock-gate latch 220 are local to the asynchronous interface between scan flip-flop 202 and scan flip-flop 206 and are not shared by logic that is outside this interface.

Logic is provided to apply a one-hot control and an inverted value of the one-hot control at an asynchronous signal crossing between the clock domains. When the signal dft_onehot_ctrl 222 is asserted ("1"), scan flip-flop 202 (but not scan flip-flop 206) receives a clock pulse. When dft_onehot_ctrl 222 is de-asserted ("0"), scan flip-flop 206 (but not scan flip-flop 202) receives a clock pulse. If dft_onehot_ctrl 222 is provided from a stable (e.g., shift-only) scan flip-flop, it ensures that for any given test pattern, only one of scan flip-flop 202 and scan flip-flop 206 receives a clock pulse at a given time. As a result, a testing tool need not enforce one-hot control for complete clock domains, resulting in a reduction to test-time for the circuit.

Figure 2C:
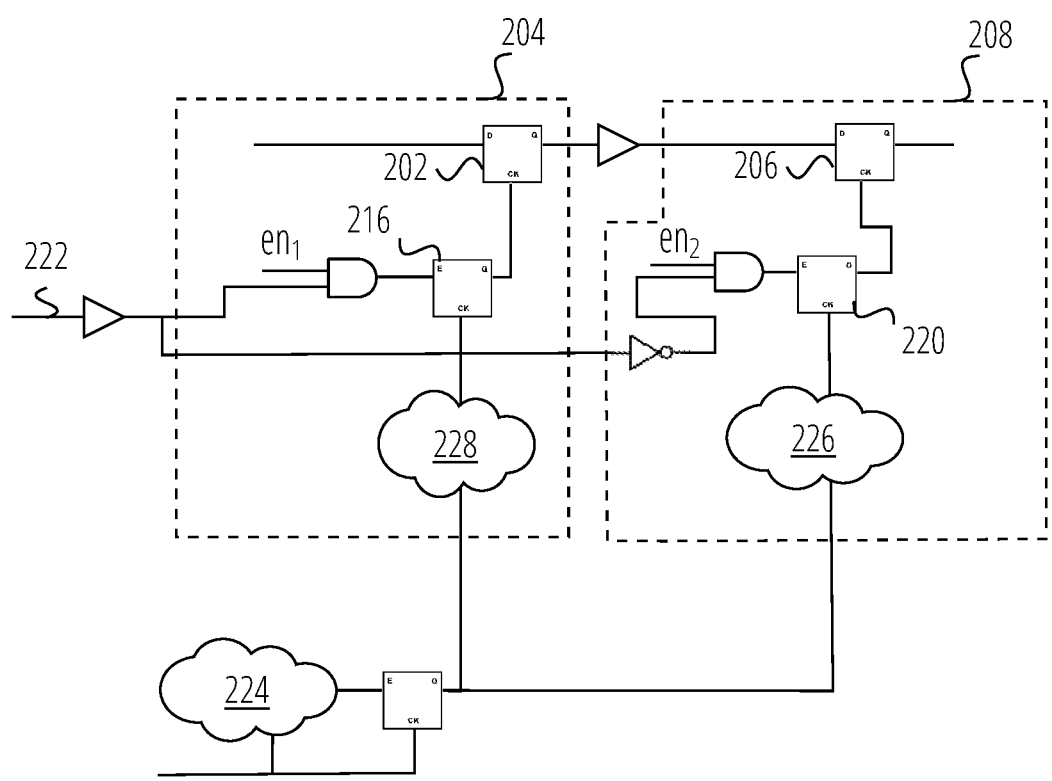
FIG. 2C depicts an embodiment in which two asynchronous clock domains share a common OCC control.

FIG. 2C depicts an embodiment in which two asynchronous clock domains share a common OCC control 224. This situation may occur in circuits wherein the clock signals $CLK_A$ and $CLK_B$ are driven from a common parent clock $CLK_P$ to local clocking logic 226, clocking logic 228, without local OCC controls. When only the parent clock $CLK_P$ is provided with OCC controls, the test tool does not have a mechanism to enforce one-hot clocking between asynchronous clock domains, such that X-valued signals negatively affect both test coverage and testing time.

Asynchronous relations may not be limited to only two clock domains at a time. There may be any number of clock domains that needs to maintain one-hot clock status with any other clock domain. Some complicated logic blocks may comprise many clock domains operating at the same time. Exact one-hot relations between these domains may not be known or determined until very late stages in a project cycle. Programmable one-hot control logic operable on large numbers of clock domains is therefore advantageous. For example it may be desirable that such logic be programmable via JTAG to remove some of the clock domains from the one-hot constraints. This enables the flexibility to provide the one-hot control logic independently of prior knowledge of exact one-hot relations between clock domains.

Figure 3:
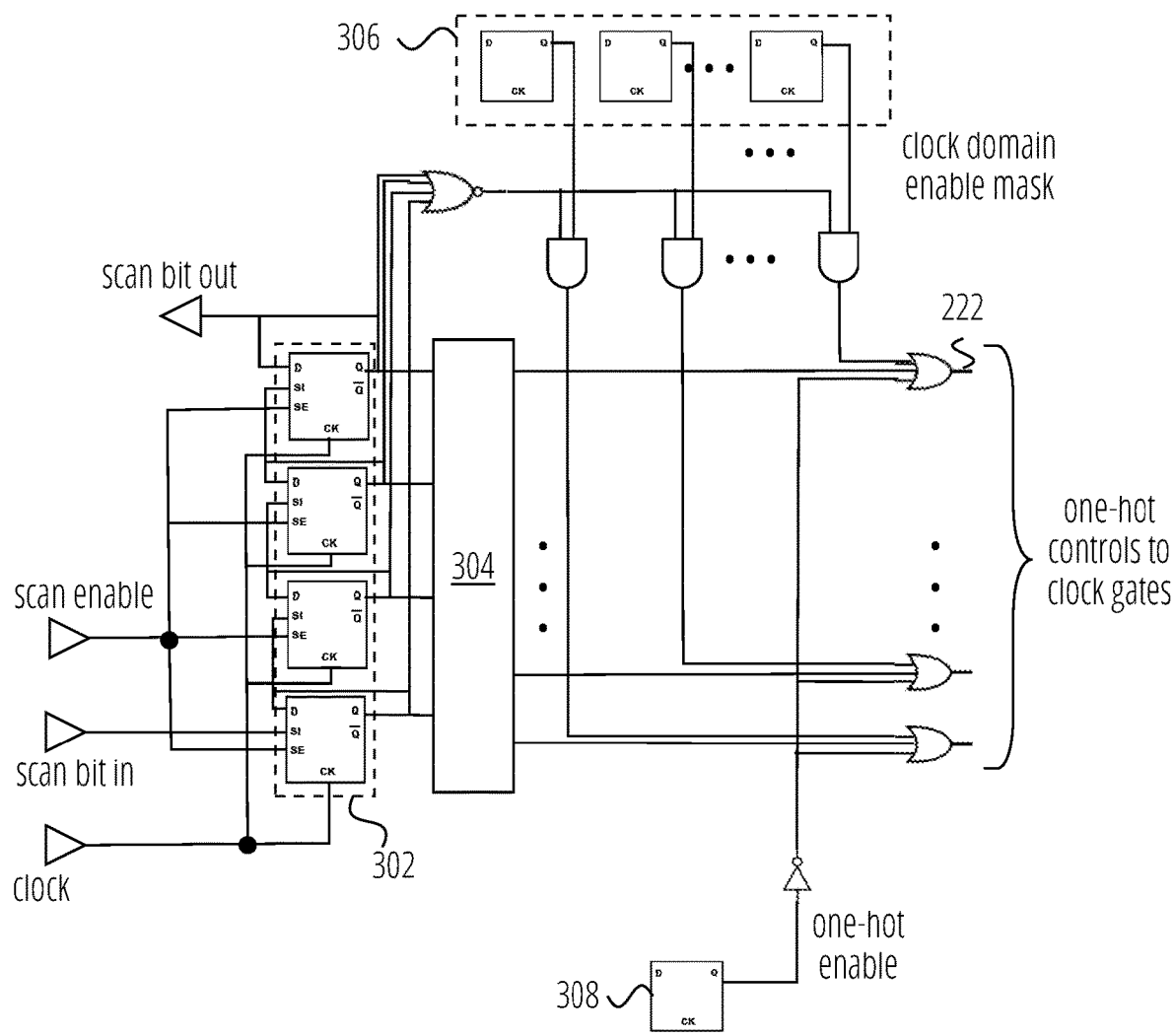
FIG. 3 depicts a circuit system for providing one-hot control logic that may be programmatically adjusted based on particular clock domains to which to apply one-hot control.

FIG. 3 depicts a circuit system for providing one-hot control logic that may be programmatically adjusted based on particular clock domains to which to apply one-hot control. The exemplary embodiment may be utilized to independently control up to fifteen asynchronous clock domains.

The circuit comprises a block of scan flip-flops 302. The scan flip-flops 302 in this example are shift-only recirculating scan flip-flops. A testing tool may load any four-bit value on these flip-flops. The scan flip-flops 302 store the shifted value and provide stable outputs during the capture phase. For N one-hot control signals, a number ceil(log(N)) scan flip-flops are utilized, where the ceil function returns the smallest integer bigger than or equal to the input parameter. Outputs of the scan flip-flops 302 are input to a decoder 304. The scan flip-flops 302 are controlled by the testing tool and determine which clock domains may be toggled for each test pattern.

The decoder 304 transforms the combined inputs of the scan flip-flops 302 into a one-hot output signal. Exemplary decoder logic is provided in Table 1 below.

The circuit further comprises JTAG flip flops 306 for programmability. Values may be loaded into the JTAG flip flops 306 to remove specific clock domains from the one-hot constraints. For a number N of one-hot control signals, N JTAG flip-flops are utilized. Collectively, the outputs of the JTAG flip flops 306 form a clock domain mask for applying one-hot control. An additional JTAG flip-flop 308 (i.e., a "global" one-hot control) is utilized to disable all one-hot controls in the functional mode of the circuit under test. The JTAG flip-flop 308 may be programmed to enable one-hot controls only for scan test mode to prevent any interference of the system with functional operation of the circuit to test.

The circuit in one embodiment thus may include a bank of scan registers (e.g., the scan flip-flops 302) that are configured to generate a scan code, wherein the decoder 304 is configured to translate the scan code into a plurality of individual one-hot controls for local scan registers in a plurality of clock domains. The circuit may further include bank of programmable registers (e.g., the JTAG flip flops 306) configured to generate an enable mask for local clock gates of the local scan registers of the different clock domains.

The circuit may also include logic to cause the enable mask to take affect only when the scan code is 0. This logic is explained in more detail below.

Some additional combinational logic is utilized to generate the final one-hot control signals. This logic combines the one-hot controls, the clock domain enable mask, and the global one-hot control enable signal. Those of skill in the art will readily recognize the nature and operation of this combinational logic from the gate symbols utilized to depict it. Additional combinational logic (e.g., a bank of AND gates, not depicted) may be utilized to provide DFT control over local clock gate enable signals.

The programming of the JTAG flip flops 306 and thus the clock domain mask takes affect once each of the scan flip-flops 302 store a zero (0) value. In this case, if any of the JTAG flip flops 306 are programmed to 1, the corresponding local clock gates will be enabled. Sequencing in this fashion enables the test tool to toggle multiple clock domains at the same time. Any value other than "0000" stored in the scan flip-flops 302 translates into a one-hot control signal to one (and only one) of the local clock gates to be enabled at a time, thus maintaining one-hot constraints.

TABLE 1

| Input Bit Sequence From Scan Flops | Output One-Hot Control |
| --- | --- |
| 0000 | 000000000000000 |
| 0001 | 000000000000001 |
| 0010 | 000000000000010 |
| 0011 | 000000000000100 |
| 0100 | 000000000001000 |
| 0101 | 000000000010000 |
| 0110 | 000000000100000 |
| 0111 | 000000001000000 |
| . . . | . . . |
| 1111 | 100000000000000 |

Table 1 depicts exemplary decoder 304 logic for one-hot control of fifteen different clock domains.

Figure 4:
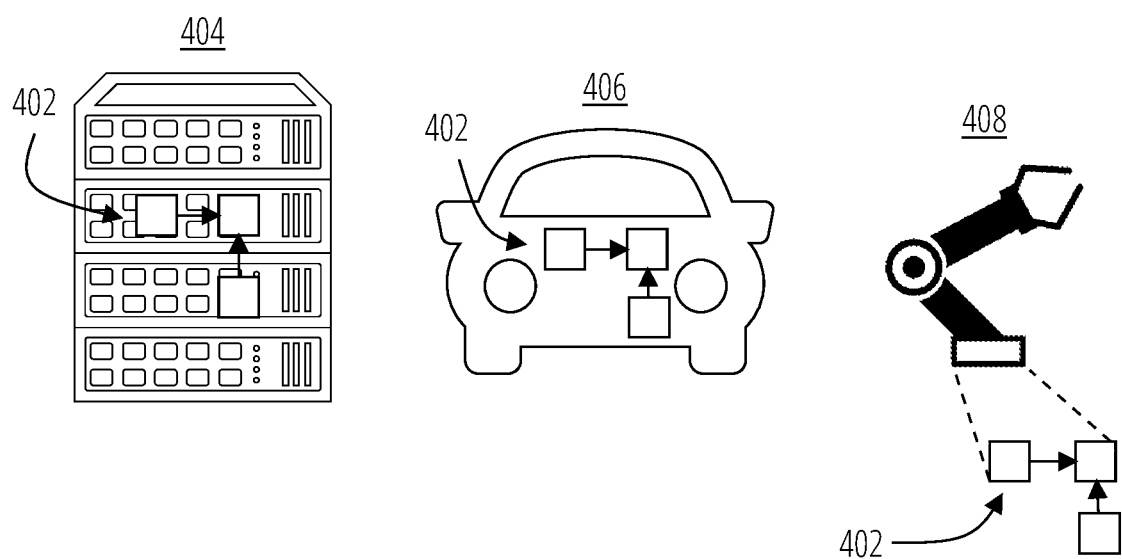
FIG. 4 depicts a circuit system 402 in accordance with one embodiment.

FIG. 4 depicts exemplary scenarios for use of a circuit system 402 in accordance with some embodiments. A circuit system 402 may be utilized in a computing system 404, a vehicle 406, and a robot 408, to name just a few examples. The circuit system 402 may comprise two or more asynchronous clock domains and one-hot control logic in accordance with the embodiments disclosed herein.

LISTING OF DRAWING ELEMENTS 202 scan flip-flop
204 clock domain
206 scan flip-flop
208 clock domain
210 OCC control
212 OCC control
214 clock-gate latch
216 clock-gate latch
218 clock-gate latch
220 clock-gate latch
222 dft_onehot_ctrl
224 OCC control
226 clocking logic
228 clocking logic
302 scan flip-flops
304 decoder
306 JTAG flip flops
308 JTAG flip-flop
402 circuit system
404 computing system
406 vehicle
408 robot Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A circuit comprising:
   a plurality of scan registers;
   a decoder configured to translate a combined output of the scan registers into a plurality of one-hot controls;
   local clock gates in a plurality of different clock domains coupled to receive the one-hot control si a first of the local clock gates in a first clock domain coupled to receive one of the one-hot controls;
   an inverter configured at a clock domain crossing from the first clock domain to a second clock domain; and
   a second of the local clock gates in the second clock domain coupled to receive an inverted version of the one of the one-hot controls from the inverter.

2. The circuit of claim 1, wherein the scan registers are scan flip-flops.

3. The circuit of claim 1, further comprising:
   a plurality of programmable registers; and
   logic to apply outputs of the programmable registers to selectively enable and disable the local clock gates of the different clock domains.

4. The circuit of claim 3, wherein the programmable registers comprise flip-flops.

5. The circuit of claim 1, further comprising:
   a programmable bit storage element; and
   logic to apply an output of the programmable bit storage element register to disable all of the one-hot controls.

6. The circuit of claim 5, wherein the programmable bit storage element is a flip-flop.

7. The circuit of claim 1, wherein the first clock domain and the second clock domain operate from different on-chip clock controls.

8. The circuit of claim 1, wherein the first clock domain and the second clock domain operate from a common on-chip clock control.

9. The circuit of claim 1, wherein the first of the local clock gates and the second of the local clock gates control an asynchronous signal crossing between a scan register in the first clock domain and a scan register in the second clock domain.

10. The circuit of claim 7, further comprising:
    logic to enable or disable the local clock gates based on values of the one of the one-hot controls and a local enable signal.

11. A circuit comprising:
    a bank of scan registers configured to generate a scan code;
    a decoder configured to translate the scan code into a plurality of individual one-hot controls for local scan registers in a plurality of clock domains;
    a bank of programmable registers configured to generate an enable mask for local clock gates of the local scan registers; and
    logic to apply particular ones of the plurality of individual one-hot controls and inverted values of particular ones the plurality of individual one-hot controls at asynchronous signal crossings between the clock domains.

12. The circuit of claim 11, further comprising logic to cause the enable mask takes affect only when the scan code is 0.

13. The circuit of claim 11, further comprising:
    logic to generate a global one-hot control enable signal.

14. The circuit of claim 11, further comprising:
    logic to combine the one hot controls, the enable mask with a global one-hot control enable signal.

15. The circuit of claim 11, wherein each of the clock domains comprises:
    one or more of the local scan registers;
    one or more of the local clock gates; and
    logic to enable or disable the local clock gates based on at least one of the plurality of individual one-hot controls.

16. A method comprising:

shifting a bit sequence into a plurality of scan registers;

operating a decoder to translate a combined output of the scan registers into a plurality of one-hot controls;

applying the one-hot controls to a plurality of local clock gates for a plurality of different local scan registers in different clock domains; and applying a particular one of the one-hot controls and an inverted value of the particular one of the one hot controls at an asynchronous signal crossing between a first of the local clock gates in a first clock domain and a second of the local clock gates in a second clock domain, respectively.

17. The method of claim 16, further comprising:

programming a plurality of registers with a mask; and applying the mask to selectively enable and disable the local clock gates of the plurality of different local scan registers.

\* \* \* \* \*